(12) United States Patent
Mehta et al.

(10) Patent No.: US 11,545,441 B2
(45) Date of Patent: Jan. 3, 2023

(54) SEMICONDUCTOR PACKAGE HAVING WAFER-LEVEL ACTIVE DIE AND EXTERNAL DIE MOUNT

(71) Applicant: Intel Corporation, Santa Clara, CA (US)

(72) Inventors: Vipul Vijay Mehta, Chandler, AZ (US); Eric Jin Li, Chandler, AZ (US); Sanka Ganesan, Chandler, AZ (US); Debendra Mallik, Chandler, AZ (US); Robert Leon Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/102,726

(22) Filed: Nov. 24, 2020

(65) Prior Publication Data

US 2021/0082826 A1   Mar. 18, 2021

Related U.S. Application Data

(63) Continuation of application No. 16/461,316, filed as application No. PCT/US2016/069344 on Dec. 29, 2016, now Pat. No. 10,910,317.

(51) Int. Cl.
*H01L 23/538* (2006.01)
*H01L 21/48* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC .................................................. H01L 23/5389
(Continued)

(56) References Cited

U.S. PATENT DOCUMENTS 9,105,647 B2   8/2015   Hu et al.
9,368,474 B2   6/2016   Matsubara et al.
(Continued)

FOREIGN PATENT DOCUMENTS

CN   102254835   11/2011
CN   103839894   6/2014
(Continued)

OTHER PUBLICATIONS

International Search Report and Written Opinion for International Patent Application No. PCT/US2016/069344 dated Sep. 29, 2017, 11 pgs.
(Continued)

*Primary Examiner* — Ajay Arora
(74) *Attorney, Agent, or Firm* — Schwabe, Williamson & Wyatt, P.C.

(57) ABSTRACT

Semiconductor packages and package assemblies having active dies and external die mounts on a silicon wafer, and methods of fabricating such semiconductor packages and package assemblies, are described. In an example, a semiconductor package assembly includes a semiconductor package having an active die attached to a silicon wafer by a first solder bump. A second solder bump is on the silicon wafer laterally outward from the active die to provide a mount for an external die. An epoxy layer may surround the active die and cover the silicon wafer. A hole may extend through the epoxy layer above the second solder bump to expose the second solder bump through the hole. Accord-
(Continued)

ingly, an external memory die can be connected directly to the second solder bump on the silicon wafer through the hole.

16 Claims, 6 Drawing Sheets

(51) Int. Cl.
*H01L 21/56* (2006.01)
*H01L 21/683* (2006.01)
*H01L 21/78* (2006.01)
*H01L 23/31* (2006.01)
*H01L 25/065* (2006.01)
*H01L 23/48* (2006.01)
*H01L 23/498* (2006.01)
*H01L 23/14* (2006.01)
*H01L 21/768* (2006.01)

(52) U.S. Cl.
CPC ........ *H01L 21/4857* (2013.01); *H01L 21/561* (2013.01); *H01L 21/563* (2013.01); *H01L 21/565* (2013.01); *H01L 21/6835* (2013.01); *H01L 21/78* (2013.01); *H01L 23/3128* (2013.01); *H01L 23/3135* (2013.01); *H01L 23/48* (2013.01); *H01L 23/49827* (2013.01); *H01L 23/5383* (2013.01); *H01L 23/5384* (2013.01); *H01L 23/5386* (2013.01); *H01L 25/0655* (2013.01); *H01L 21/76898* (2013.01); *H01L 23/147* (2013.01); *H01L 23/49816* (2013.01); *H01L 2221/68331* (2013.01); *H01L 2221/68359* (2013.01); *H01L 2224/73204* (2013.01); *H01L 2924/181* (2013.01); *H01L 2924/18161* (2013.01)

(58) Field of Classification Search
USPC ........................................................ 257/668
See application file for complete search history.

(56) References Cited

U.S. PATENT DOCUMENTS

| 9,412,661 | B2 | 8/2016 | Lu et al. |
| 10,290,621 | B2 | 5/2019 | Kim et al. |
| 10,580,761 | B2 * | 3/2020 | Cheah ................. H01Q 21/061 |
| 2008/0064142 | A1 | 3/2008 | Gan et al. |
| 2010/0327419 | A1 | 12/2010 | Muthukumar |
| 2013/0105991 | A1 | 5/2013 | Gan et al. |
| 2013/0200528 | A1 | 8/2013 | Lin et al. |
| 2015/0318262 | A1 | 11/2015 | Gu et al. |

FOREIGN PATENT DOCUMENTS

| KR | 10-2016-0030861 | 3/2016 |
| TW | 201608695 | 3/2016 |

OTHER PUBLICATIONS

International Preliminary Report on Patentability for International Patent Application No. PCT/US2016/069344 dated Jul. 11, 2019, 9 pages.
Office Action for Chinese Patent Application No. 201680091229.8 dated Oct. 9, 2022, 10 pgs., no translation.

* cited by examiner

SEMICONDUCTOR PACKAGE HAVING WAFER-LEVEL ACTIVE DIE AND EXTERNAL DIE MOUNT

CROSS-REFERENCE TO RELATED APPLICATION

This patent application is a continuation of U.S. patent application Ser. No. 16/461,316, filed May 15, 2019, which is a U.S. National Phase Application under 35 U.S.C. § 371 of International Application No. PCT/US2016/069344, filed Dec. 29, 2016, entitled "SEMICONDUCTOR PACKAGE HAVING WAFER-LEVEL ACTIVE DIE AND EXTERNAL DIE MOUNT," which designates the United States of America, the entire disclosure of which are hereby incorporated by reference in their entirety and for all purposes.

TECHNICAL FIELD

Embodiments are in the field of integrated circuit packages and, in particular, semiconductor packages having wafer-level packaging.

BACKGROUND

The mobile semiconductor industry is continually working toward smaller and thinner semiconductor packages for use in mobile device products. Various solutions have emerged to reduce semiconductor package size. For example, efforts have focused on reducing an overall thickness of a system-on-chip die or an organic embedded trace substrate that holds the die. Other solutions including moving away from package-on-package configurations toward wide I/O memory configurations. Furthermore, wafer-level packaging, i.e., packaging integrated circuits as part of a silicon wafer, have been proposed to provide chip-scale packages by eliminating the organic embedded trace substrate. In any of these solutions, it is important to maximize functionalities of the semiconductor package, e.g., compass, sensing, wireless, or power management functions of a smartphone, despite the size reduction.

DESCRIPTION OF EMBODIMENTS

Figure 1:
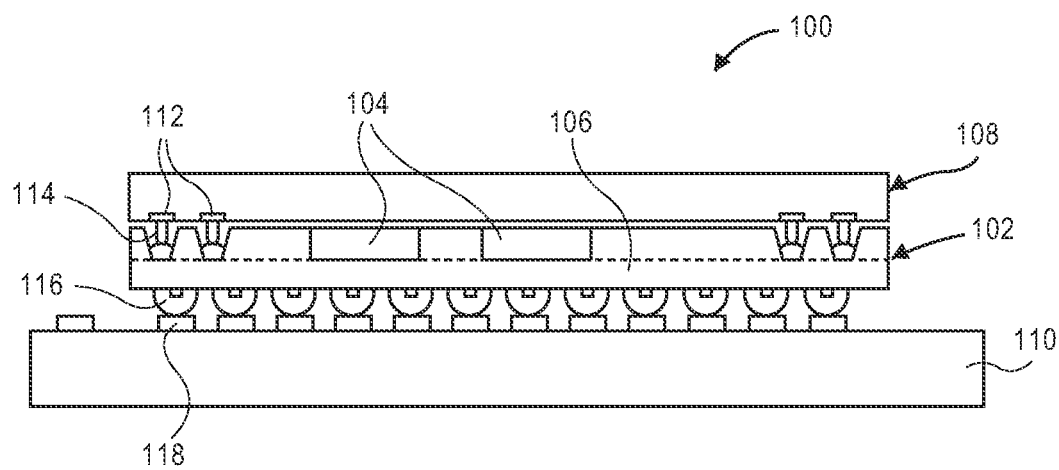
FIG. 1 illustrates a cross-sectional view of a semiconductor package assembly, in accordance with an embodiment.

Semiconductor packages including an active die and an external die mount on a silicon wafer, and methods of fabricating such semiconductor packages, are described. In the following description, numerous specific details are set forth, such as packaging and interconnect architectures, in order to provide a thorough understanding of embodiments. It will be apparent to one skilled in the art that embodiments may be practiced without these specific details. In other instances, well-known features, such as specific semiconductor fabrication processes, are not described in detail in order to not unnecessarily obscure embodiments. Furthermore, it is to be understood that the various embodiments shown in the Figures are illustrative representations and are not necessarily drawn to scale.

There are existing solutions to make mobile semiconductor packages smaller and thinner. The solutions, however, can have trade-offs in terms of functionality and/or manufacturing costs. For example, solutions that have been proposed for reducing a size of the system-on-chip die or the organic embedded trace substrate remove functionalities of those components to achieve the smaller size. On the other hand, solutions that have been proposed for eliminating the organic embedded trace substrate altogether may require the formation of copper pillars around an active die. Similarly, solutions that have been proposed for wide I/O memory configurations may require the fabrication of through-silicon-vias and bonding on the through-silicon-vias. Manufacturing processes for building copper pillars or through-silicon-vias precisely can be complex, and thus, such solutions probably have low manufacturing yields and high manufacturing costs. Accordingly, a low-cost solution for reducing mobile semiconductor package size without sacrificing functionality is needed.

In an aspect, a semiconductor package includes chip-to-wafer packaging that eliminates a need for an organic embedded trace substrate and die-to-substrate interconnects that such substrates require. Given that organic embedded trace substrates typically have a thickness of 175 µm, and die-to-substrate interconnects for such substrates typically have thicknesses of 45 µm, an overall thickness of the semiconductor package described below can be approximately 220 µm thinner than typical mobile semiconductor packages. The below-described semiconductor package can include an active die mounted on a silicon wafer, and the silicon wafer can incorporate functionalities, i.e., integrated circuits. Accordingly, the semiconductor package size can be reduced without sacrificing functionality. The semiconductor package can include an external die mount, e.g., a solder bump, on the silicon wafer to allow an external memory die to be mounted directly on the silicon wafer. Accordingly, the external memory can be connected directly to the silicon wafer using high-volume and low-cost manufacturing operations, such as solder reflow processes, without the need to form complex interconnect structures such as copper pillars.

Referring to FIG. 1, a sectional view of a semiconductor package assembly is illustrated in accordance with an embodiment. A semiconductor package assembly 100 may include one or more semiconductor packages 102 having active semiconductor die(s) 104. For example, semiconductor package 102 may be a WL-CSP having a chip-to-package assembly without an organic embedded trace substrate.

Active die(s) 104 may be electrically connected to each other or to external components by intervening structures, such as a silicon wafer 106. For example, as described below, electrical interconnects such as solder bumps, through-wafer-vias, or redistribution lines can electrically connect active die(s) 104 to an external die 108 or a printed circuit board 110.

In an embodiment, external die 108 has one or more I/O contacts 112, and may be connected directly to silicon wafer 106 in a chip-to-wafer assembly. Chip-to-wafer interconnects 114, e.g., copper pillars, bonding wires, or solder bumps, may extend from I/O contact 112 to a corresponding electrical interconnect on silicon wafer 106. For example, I/O contact 112 may connect to a solder bump on silicon wafer 106 laterally outward from active die 104, as described below.

External die 108 may be any type of active die. In an embodiment, external die 108 is a high-capacity memory die. The high-capacity memory die may communicate with active dies 104 to facilitate faster processing by active dies 104 for various mobile semiconductor package functionalities. For example, semiconductor package may be a WL-CSP used in a mobile device antenna circuit application.

In an embodiment, external die 108 may be used in the form of a WL-CSP having one or more silicon chips. For example, one, or a group of, external die(s) 108 having redistribution layer(s) and solder bumps 112 may be used. Accordingly, small packages, e.g., WL-CSP packages, may be used as external die 108 mounted on semiconductor package 102.

Semiconductor package 102 may be mounted on printed circuit board 110. Electrical interconnections between active die(s) 104, silicon wafer 106, and printed circuit board 110 may include solder balls and/or other metallic bump, trace, or wire interconnects. By way of example, semiconductor package 102 of semiconductor package assembly 100 may be a ball grid array (BGA) component having several solder balls 116 arranged in a ball field. That is, an array of solder balls 116 may be arranged in a grid or other pattern. Printed circuit board 110 may include several contact pads 118, and each solder ball 116 may be mounted and attached to a corresponding contact pad 118. Printed circuit board 110 may be a motherboard or another printed circuit board of a computer system or device, such as a smartphone. Printed circuit board 110 may route signals to external device connectors (not shown). Accordingly, the solder ball and contact pad attachments may provide an electrical interface between active die(s) 104 of semiconductor package 102 and an external device.

Figure 2:
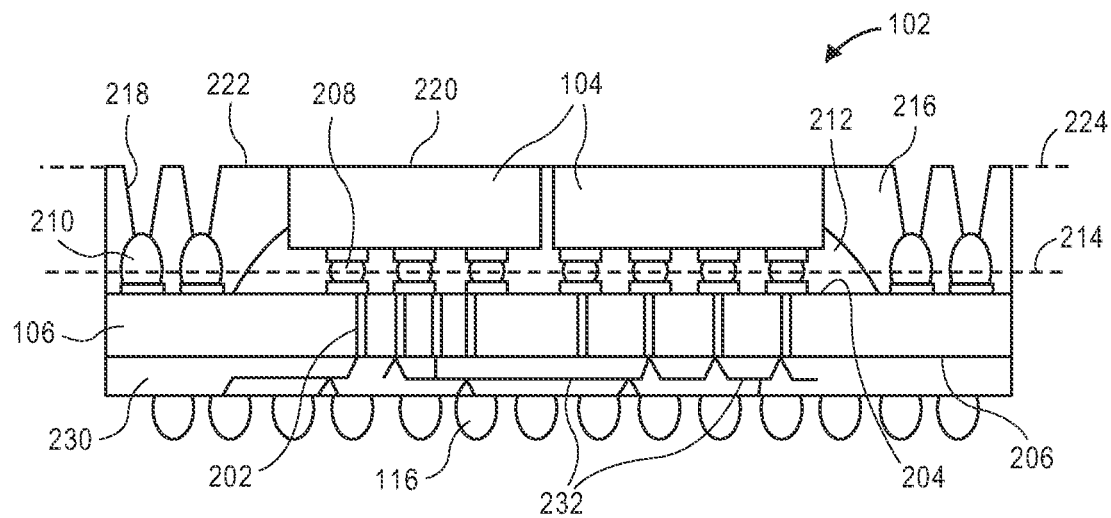
FIG. 2 illustrates a cross-sectional view of a semiconductor package including an active die and an external die mount on a silicon wafer, in accordance with an embodiment.

Referring to FIG. 2, a cross-sectional view of a semiconductor package including an active die and an external die mount on a silicon wafer is shown in accordance with an embodiment. Semiconductor package 102 may include silicon wafer 106 having various electrical interconnects for coupling to other components. For example, silicon wafer 106 may have one or more through-wafer-vias 202 extending from a top surface 204 toward a bottom surface 206 for connecting electrical contacts on top surface 204 to electrical contacts on bottom surface 206. Through-wafer-via 202 may be an electrically conductive structure extending partly or entirely through a thickness of silicon wafer 106. For example, through-wafer-via 202 may be a copper interconnect tunneling through the silicon material of silicon wafer 106. Through-wafer-via 202 may have a height equal to the thickness of silicon wafer 106. That is, silicon wafer 106 may have a wafer thickness between top surface 204 and bottom surface 206, and through-wafer-via 202 may extend from top surface 204 to bottom surface 206.

A material type and a size of silicon wafer 106 may be distinguished from corresponding characteristics of an organic embedded trace substrate. First, wafer 106 may be fabricated from silicon material, and the embedded trace substrate may be formed from an organic resin material. Second, organic embedded trace substrates typically have thicknesses in a range of 200-300 µm, and silicon wafer 106 can have a thickness between top surface 204 and bottom surface 206 of less than 100 µm.

Semiconductor package 102 may include solder bumps for electrically connecting silicon wafer 106 to other package components. For example, several solder bumps may be disposed on top surface 204 of silicon wafer 106 to connect contact pads on top surface 204 to active die 104 and/or external die 108. In an embodiment, a first solder bump 208 is disposed on top surface 204 between active die 104 and silicon wafer 106. More particularly, active die 104 may be mounted on silicon wafer 106, and first solder bump 208 may attach active die 104 to silicon wafer 106.

A second solder bump 210 may be disposed on top surface 204 laterally outward from active die 104. The term laterally outward indicates that second solder bump 210 is disposed on top surface 204 in a transverse direction from an outward edge of active die 104. That is, second solder bump 210 may not be vertically between active die 104 and silicon wafer 106. Furthermore, second solder bump 210 may not be within an underfill material 212 that surrounds first solder bump 208. Accordingly, first solder bump 208 and second solder bump 210 may be coplanar with each other within a transverse plane 214 parallel to top surface 204. That is, since first solder bump 208 and second solder bump 210 are both disposed on top surface 204, as opposed to being offset from top surface 204 by a copper pillar, the solder bumps 208, 210 may be aligned in a transverse direction at a same vertical location.

First solder bump 208 and second solder bump 210 may be suited to an intended interconnect function. More particularly, a size of each solder bump on top surface 204 may correspond to an intended interconnection. In an embodiment, first solder bump 208 is smaller than second solder bump 210. For example, first solder bump 208 may provide an interconnection between an electrical contact on active die 104 and an electrical contact on top surface 204, while second solder bump 210 may provide an interconnection between chip-to-wafer interconnect 114 and an electrical contact on top surface 204. Chip-to-wafer interconnect 114 may have a larger profile than the electrical contact on active die 104, and thus, second solder bump 210 may have a larger cross-sectional dimension than first solder bump 208. The variation in solder bumps sizes may lend the solder bumps to formation by different processes. For example, the smaller first solder bump 208 may be fabricated by a plating operation, and the larger second solder bump 210 may be fabricated by a top-side-ball-attach operation, as described below. Accordingly, first solder bump 208 may be a plated solder bump, and second solder bump 210 may be a top-side-ball-attached solder bump.

In an embodiment, an epoxy layer 216 surrounds four or more sides of active die(s) 104. For example, epoxy layer 216 may be disposed over top surface 204 of silicon wafer 106, and may extend around sidewalls of active die 104 and/or a bottom surface of active die 104 facing top surface 204 of silicon wafer 106. Epoxy layer 216 may also cover a portion of second solder bump 210 laterally outward from active die 104. A hole 218 may be formed in epoxy layer 216 above second solder bump 210, however, to expose second solder bump 210 through hole 218. That is, at least a portion of second solder bump 210 may be exposed through hole 218 extending through the epoxy layer 216. Thus, chip-to-wafer interconnect 114 may extend from I/O contact 112 to second solder bump 210 through hole 218 to electrically connect I/O contact 112 to second solder bump 210 through hole 218.

In an embodiment, an upper surface of semiconductor package 102 is flat. The upper surface of semiconductor package 102 may include an upper die surface 220 of active die 104 and an upper epoxy surface 222 of epoxy layer 216, both of which may combine to form a flat surface. For example, upper die surface 220 and upper epoxy surface 222 may be coplanar within a second transverse plane 224. Second transverse plane 224 may be vertically offset from transverse plane 214 passing through the solder bumps on top surface 204 of silicon wafer 106. Accordingly, second transverse plane 224 may be parallel to top surface 204.

Semiconductor package 102 may include a redistribution layer 230 mounted on bottom surface 206 of silicon wafer 106. Redistribution layer 230 can have several redistribution lines 232 to conduct electrical signals from electrical contacts on bottom surface 206 of silicon wafer 106 to solder balls 116. For example, at least one redistribution line 232 may be electrically connected to through-wafer-via 202 at a first end, and to solder ball 116 at a second end. That is, solder balls 116 on redistribution layer 230 may be electrically connected to corresponding redistribution lines 232. Redistribution line 232 may extend through redistribution layer 230, and at least a portion of a redistribution line 232 may be oriented in a transverse direction. Accordingly, redistribution lines 232 of redistribution layer 230 may fan-out electrical signals from silicon wafer 106 to electrical contacts on printed circuit board 110.

The above-described structure of semiconductor package assembly 100, and more particularly, of semiconductor package 102, provides an integrated package-on-package structure for attaching external die 108 to semiconductor package 102 in a chip-to-wafer assembly. Furthermore, the structure is a wafer-level chip scale package (WL-CSP) that can reduce an overall size of semiconductor package assembly 100 without sacrificing functionalities critical to mobile device applications. As described below, the WL-CSP architecture can be realized through available, low-cost manufacturing processes.

Figure 3:
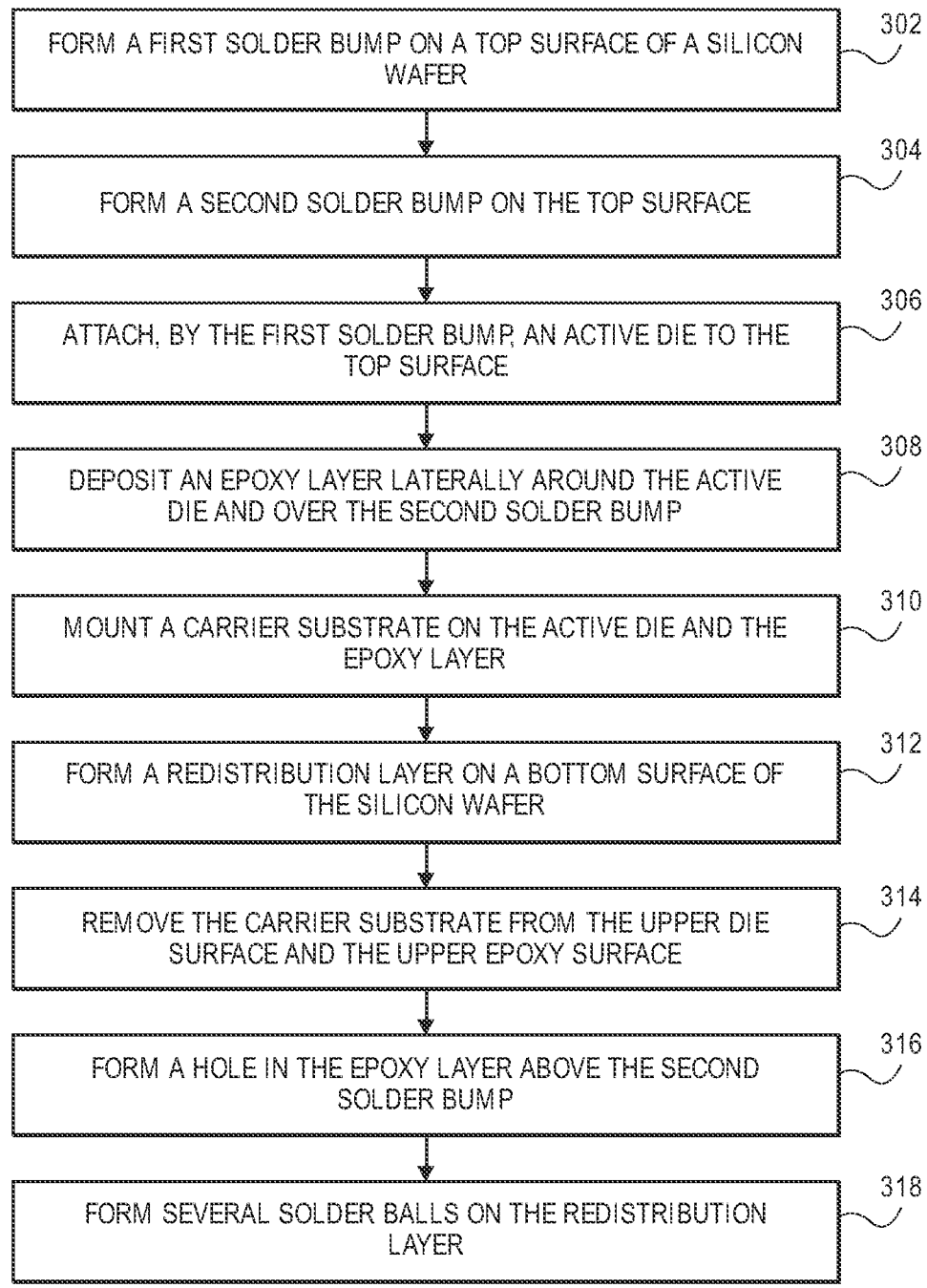
FIG. 3 illustrates a flowchart of a method of fabricating a semiconductor package including an active die and an external die mount on a silicon wafer, in accordance with an embodiment.
Figure 4A:
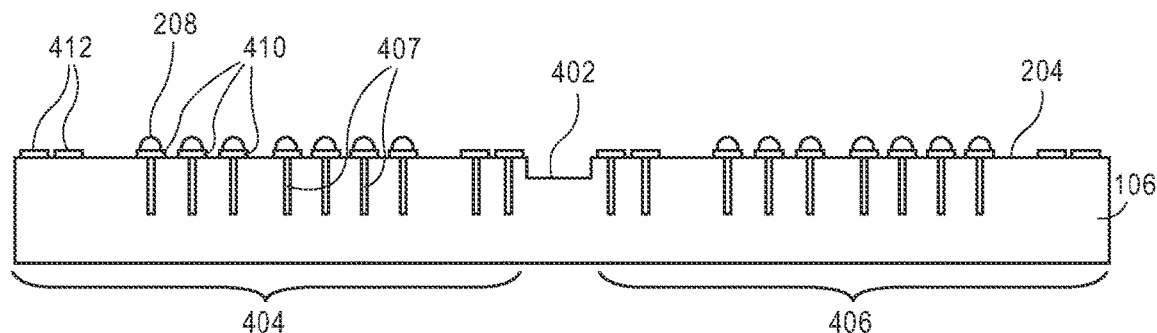
FIGS. 4A-4I illustrate operations in a method of fabricating a semiconductor package including an active die and an external die mount on a silicon wafer, in accordance with an embodiment.
Figure 4B:
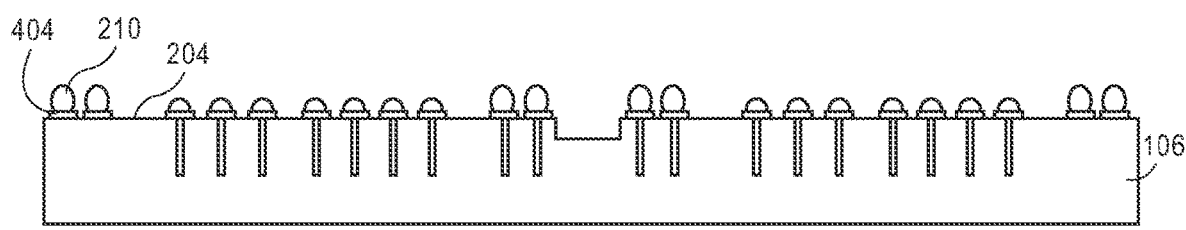
Figure 4C:
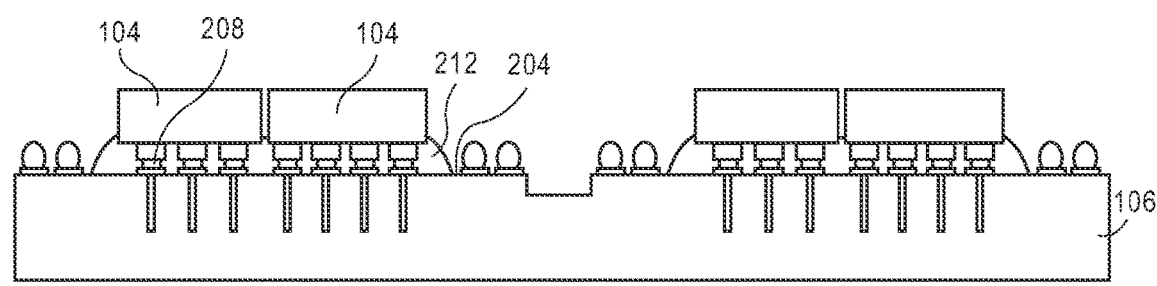
Figure 4D:
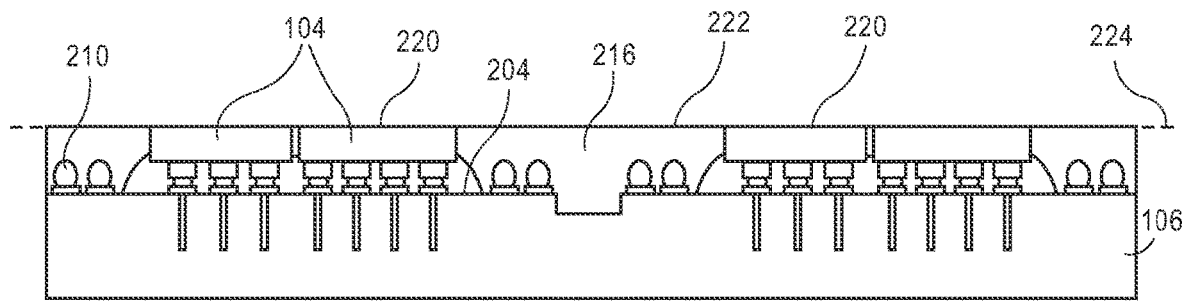
Figure 4E:
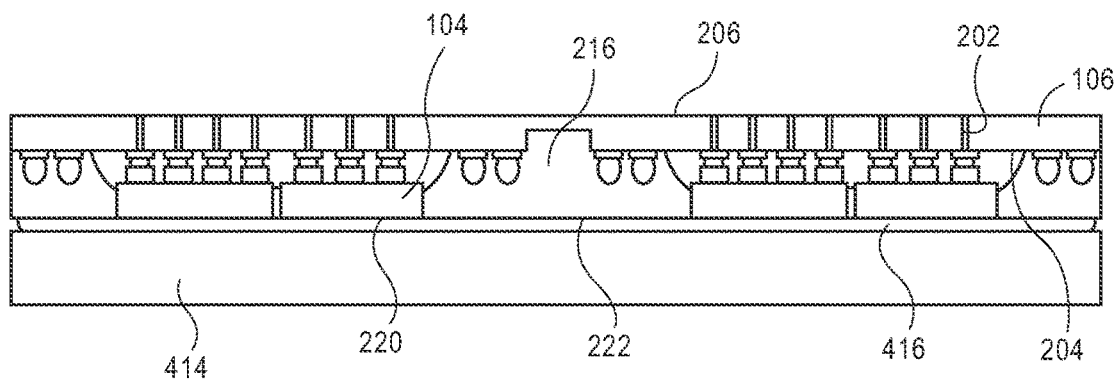
Figure 4F:
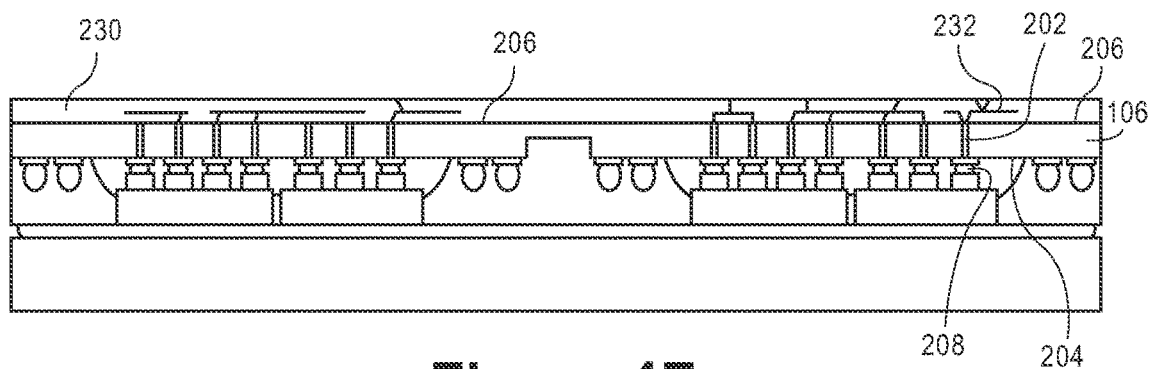
Figure 4G:
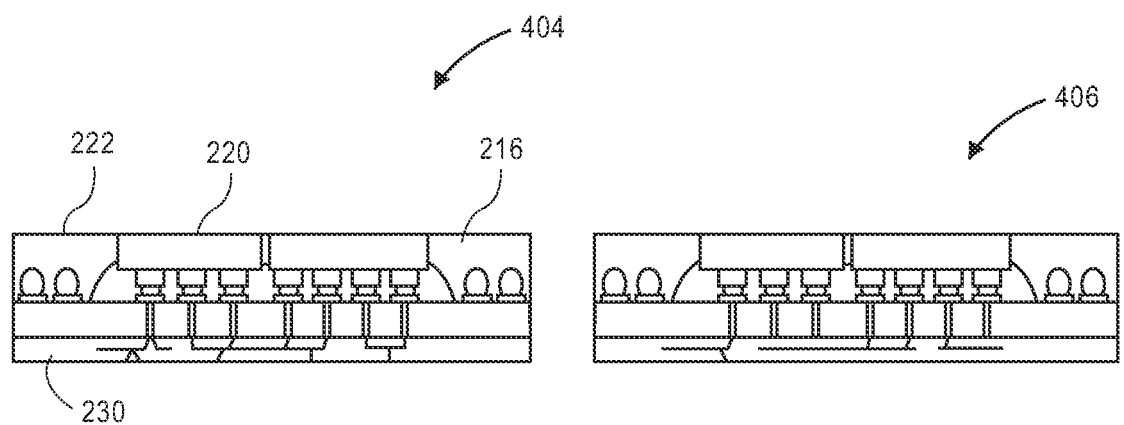
Figure 4H:
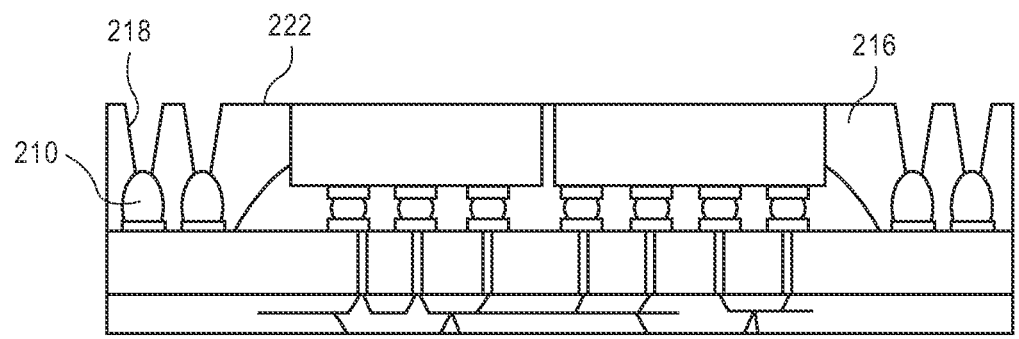
Figure 4I:
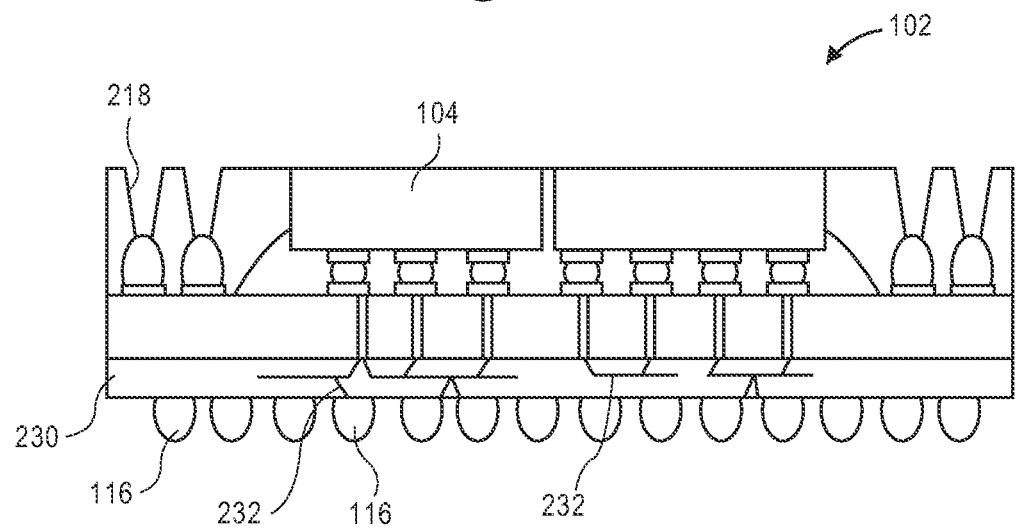

Referring to FIG. 3, a flowchart of a method of fabricating a semiconductor package including an active die and an external die mount on a silicon wafer is shown in accordance with an embodiment. FIGS. 4A-4I illustrate operations in the method of FIG. 3, and thus, FIGS. 3-4I are described in combination below.

The method described below can be used to fabricate several WL-CSPs from an initial silicon wafer 106. For example, at an initial stage, silicon wafer 106 may include a singulation trench 402 separating a first wafer region 404 from an adjacent second wafer region 406. As described below, several semiconductor packages 102 may be built up on the adjacent regions, and at a point in the fabrication process, the semiconductor packages 102 may be singulated along singulation trench 402 (FIG. 4G). Accordingly, although semiconductor package 102 is described above as being an individual package, it will be understood that the wafer-level architecture of semiconductor package 102 allows for several semiconductor packages 102 to be simultaneously fabricated using high-volume manufacturing processes.

At operation 302, first solder bump 208 is formed on top surface 204 of silicon wafer 106. Referring to FIG. 4A, in an embodiment, silicon wafer 106 is fabricated using a silicon technology that is high-yielding and low-cost. Silicon wafer 106 may be an active silicon wafer 106. That is, silicon wafer 106 may include one or more integrated circuits to provide functionalities, e.g., I/O, memory cache, etc., to semiconductor package 102, in addition to electrical routing.

Silicon wafer 106 and/or integrated circuits of silicon wafer 106 may be fabricated using any known silicon technology. By way of example and not limitation, the components may be fabricated using 22 nm silicon technology.

In an embodiment, silicon wafer 106 includes through-silicon-vias 407 extending from the top surface 204 midway into silicon wafer 106. For example, the through-silicon-vias 407 may extend downward from top surface 204 to a depth of 80-90 μm. As described below, the through-silicon-vias may be exposed later to form through-wafer-vias 202.

At least two sets of contact pads 118 may be formed on top surface 204 of silicon wafer 106. A first set of contact pads 410, e.g., a first set of copper pads, may be located over the through-silicon-vias 407 to provide landings for first solder bump 208 and other solder bumps intended to attach active die 104 to silicon wafer 106. First solder bump 208 and other solder bumps intended to attach active die 104 to silicon wafer 106 may be plated on first set of contact pads 410. Accordingly, solder bumps between active die 104 and silicon wafer 106 may be plated solder bumps.

A second set of contact pads 412, e.g., a second set of copper pads, may be disposed on top surface 204 laterally outward from the first set of contact pads 410. Second set of contact pads 412 may provide landings for second solder bump 210 and other solder bumps intended to connect to chip-to-wafer interconnect 114 and external die 108.

At operation 304, second solder bump 210 is formed on top surface 204 of silicon wafer 106. Referring to FIG. 4B, second solder bump 210 and other solder bumps intended to connect to chip-to-wafer interconnect 114 and external die 108 may be formed by a top-side-ball-attach (TSBA) operation. The TSBA operation is a non-plating operation using a mask and solder ball attachment process, as is known in the art. The TSBA operation can form larger solder bumps than the plating operation used to fabricate first solder bump 208. Accordingly, second solder bump 210 may be a top-side-ball-attached solder bump and may be larger than first solder bump 208. Furthermore, given that solder bumps on second set of contact pads 412 may be larger than solder bumps on first set of contact pads 410, it follows that second set of contact pads 412 may have a larger spacing, i.e., pitch, than first set of contact pads 410.

Although second solder bump 210 may be formed by a TSBA operation, such possibility is not limiting and it will be understood that second solder bump 210 may be formed by a plating operation. That is, in an embodiment, second solder bump 210 is formed on top surface 204 of silicon wafer 106. The plated second solder bump 210 may be larger than first solder bump 208, or the solder bumps may have a same size.

At operation 306, active die 104 is attached to silicon wafer 106. More particularly, referring to FIG. 4C, active die 104 may be attached to top surface 204 of silicon wafer 106 by first solder bump 208. Individual singulated system-on-chip active dies 104 may be attached to silicon wafer 106 using a solder reflow process to bond electrical contacts on the active dies 104 to electrical contacts on top surface 204 of silicon wafer 106. Any number of active dies 104 and any die type, i.e., dies having specific functionalities, may be attached to silicon wafer 106 at this stage. By way of example, active dies 104 mounted on silicon wafer 106 may include a central processing unit die and a modem die. In an embodiment, underfill material 212 is flowed between active dies 104 and silicon wafer 106 to encapsulate first solder bump 208.

At operation 308, epoxy layer 216 is deposited over silicon wafer 106. For example, referring to FIG. 4D, epoxy layer 216 may be deposited around active die 104 and over top surface 204 of silicon wafer 106. Epoxy layer 216 may cover second solder bump 210. Epoxy layer 216 may be deposited in an over molding process. The overmolded epoxy layer 216 may entirely encapsulate active dies 104. That is, epoxy layer 216 may cover an upper surface of active dies 104 after the overmolding operation is complete. The overmolded epoxy layer 216 may be too thick, and accordingly, material may be removed from the upper surface to thin the assembly.

In an embodiment, one or more of the active die 104 or epoxy layer 216 may be thinned to a predetermined depth. More particularly, active die 104 and/or epoxy layer 216 may have material removed, e.g., by grinding, from the upper surface such that upper die surface 220 of active die 104 and upper epoxy surface 222 of epoxy layer 216 are coplanar within second transverse plane 224. By way of example, the overmolded epoxy layer 216 may have a thickness of 300 μm, and the thinning operation may reduce the thickness of overmolded epoxy layer 216 to 100 μm. Functional portions of active die 104 may be within 100 μm of a bottom surface of active die 104, and thus, active dies 104 may be ground down to a height several microns above the functional portions. The thinning may expose the upper surface 220 of active dies 104 such that a profile of active dies 104 is visible from above. The thinning may or may not remove enough of the overmolded epoxy layer 216 to expose second solder bump 210. That is, in an embodiment second solder bump 210 is large enough that removal of epoxy layer 216 exposes an upper tip of second solder bump 210, making the tip visible from above (not shown).

At operation 310, a carrier substrate 414 is mounted on active die 104 and epoxy layer 216. More particularly, referring to FIG. 4E, carrier substrate 414 may be mounted on upper die surface 220 and upper epoxy surface 222. In an embodiment, carrier substrate 414 is a passive wafer formed from semiconductor, metal, or plastic material. Carrier substrate 414 may be attached to upper die surface 220 and upper epoxy surface 222 by an intervening adhesive layer 416.

Carrier substrate 414 may support the semiconductor assembly during a thinning operation. More particularly, an upper surface of the semiconductor assembly may be held by carrier substrate 414 while a bottom surface 206 of the semiconductor assembly is ground down. Grinding of the bottom surface 206 may reduce a thickness of silicon wafer 106 to a predetermined dimension. More particularly, silicon wafer 106 may be thinned until through-silicon-via 407 is converted into through-wafer-via 202. That is, after grinding, through-wafer-via 202 may extend from top surface 204 of silicon wafer 106 to bottom surface 206 of silicon wafer 106. Accordingly, through-wafer-vias 202 may be exposed from below and available to connect to redistribution lines 232 of redistribution layer 230.

At operation 312, redistribution layer 230 is formed on bottom surface 206 of silicon wafer 106. Referring to FIG. 4F, redistribution layer 230 includes redistribution line 232 electrically connected to through-wafer-via 202 extending from first solder bump 208 at top surface 204 to bottom surface 206. Redistribution layer 230 may essentially act as a substrate attached to silicon wafer 106. Redistribution layer 230 may include a buildup of dielectric layers to copper interconnect structures, and thus, redistribution layer 230 may fan-out electrical signals from through-wafer-vias 202. Signal fan-out may be necessary to prevent signal jumping and/or signal noise in semiconductor package 102. In a sense, redistribution layer 230 may perform functions similar to an organic embedded trace substrate. Redistribution layer 230, however, may be manufactured with a tighter line width and line spacing pattern, i.e., a finer L/S pattern, and thus redistribution layer 230 may provide higher signal integrity than an organic embedded trace substrate.

At operation 314, carrier substrate 414 is removed from upper die surface 220 and upper epoxy surface 222. Referring to FIG. 4G, carrier substrate 414 may be removed before forming a hole 218 in epoxy layer 216. Similarly, carrier substrate 414 may be removed before forming solder balls 116 on redistribution layer 230. It may be possible to form solder balls 116 on redistribution layer 230 before removing carrier substrate 414, however, since a melting point of solder may be greater than a melting point of adhesive layer 416, it may be more practical to remove carrier substrate 414 first.

After debonding carrier substrate 414, first wafer region 404 and second wafer region 406 may be singulated. Singulation of the individual semiconductor packages 102 may include cutting through singulation trench 402. The singulated semiconductor packages 102 may be placed into a tape-and-reel equipment, i.e., a tape-reel die sort process as is known in the art, for further processing.

At operation 316, hole 218 is formed in epoxy layer 216 above second solder bump 210. Referring to FIG. 4H, hole 218 extends vertically downward from the upper surface of semiconductor package 102, e.g., upper epoxy surface 222, and second solder bump 210 is exposed through hole 218. Hole 218 may be formed using a through-mold drilling operation, as is known in the art. The drilled holes 218 may open a space above second solder bump 210 and other solder bumps intended to connect to chip-to-wafer interconnect 114. Accordingly, second solder bump 210 may be exposed from above through hole 218.

At operation 318, several solder balls 116 are formed on redistribution layer 230. Referring to FIG. 4I, solder balls 116 are electrically connected to redistribution lines 232 of redistribution layer 230. Solder balls 116 may be formed in a ball attach process to create solder interconnects for attachment of semiconductor package 102 to printed circuit board 110. Accordingly, an integrated package-on-package structure may be provided, i.e., semiconductor package 102 having active die 104 and an external die 108 mount (second solder bump 210).

External die 108, e.g., an external memory die, may be attached to semiconductor package 102 shown in FIG. 4I. Although the external die 108 to semiconductor package 102 attachment operation is not shown, it will be understood that I/O contact 112 of external die 108 may be connected to second solder bump 210 by chip-to-wafer interconnect 114 extending through hole 218. Such connections may be made by a solder reflow process that attaches second solder bump 210 to a pin, wire, etc., electrically connected to I/O contact 112. Accordingly, the attachment of external die 108 to semiconductor package 102 can form a package-on-package assembly having a WL-CSP component.

Figure 5:
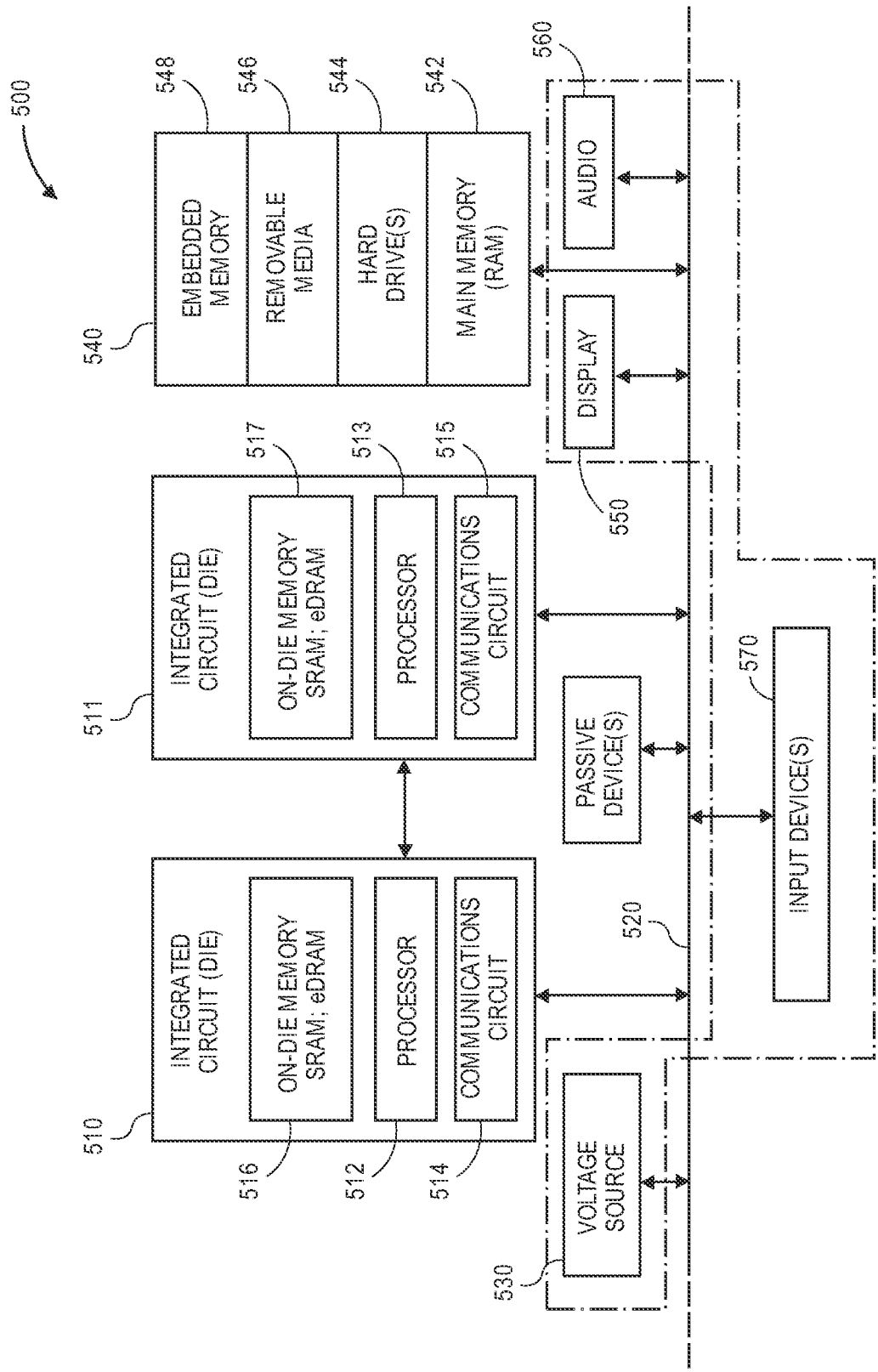
FIG. 5 is a schematic of a computer system, in accordance with an embodiment.

FIG. 5 is a schematic of a computer system, in accordance with an embodiment. The computer system 500 (also referred to as the electronic system 500) as depicted can embody a semiconductor package including an active die and an external die mount on a silicon wafer, according to any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be a server system. The computer system 500 may be a supercomputer or high-performance computing system.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package including an active die and an external die mount on a silicon wafer, as disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 511 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550, and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a semiconductor package including an active die and an external die mount on a silicon wafer, according to any of the several disclosed embodiments and their equivalents, an electronic system, a computer system, one or more methods of fabricating an integrated circuit, and one or more methods of fabricating an electronic assembly that includes a semiconductor package including an active die and an external die mount on a silicon wafer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages including an active die and an external die mount on a silicon wafer and their equivalents. A foundation substrate may be included, as represented by the dashed line of FIG. 5. Passive devices may also be included, as is also depicted in FIG. 5.

Embodiments of semiconductor packages including active dies and external die mounts on a silicon wafer are described above. In an embodiment, a semiconductor package includes a silicon wafer having a through-wafer-via extending from a top surface to a bottom surface. The semiconductor package includes a first solder bump and a second solder bump on the top surface. The semiconductor package includes an active die mounted on the silicon wafer. The active die is attached to the silicon wafer by the first solder bump. The semiconductor package includes an epoxy layer laterally around the active die and over the top surface. The epoxy layer includes a hole extending through the epoxy layer laterally outward from the active die. The second solder bump is exposed through the hole.

In one embodiment, the first solder bump and the second solder bump are coplanar within a transverse plane parallel to the top surface.

In one embodiment, the active die includes an upper die surface. The epoxy layer includes an upper epoxy surface. The upper die surface and the upper epoxy surface are coplanar within a second transverse plane vertically offset from the transverse plane.

In one embodiment, the first solder bump is smaller than the second solder bump.

In one embodiment, the first solder bump is a plated solder bump. The second solder bump is a top-side-ball-attached solder bump.

In one embodiment, the semiconductor package includes a redistribution layer mounted on the bottom surface. The redistribution layer includes several redistribution lines. At least one of the redistribution lines is electrically connected to the through-wafer-via. The semiconductor package includes several solder balls on the redistribution layer. The several solder balls are electrically connected to the several redistribution lines.

In one embodiment, the silicon wafer is an active silicon wafer having one or more integrated circuits.

In an embodiment, a semiconductor package assembly includes a semiconductor package including a silicon wafer having a through-wafer-via extending from a top surface to a bottom surface, a first solder bump and a second solder bump on the top surface, and an active die mounted on the silicon wafer. The active die is attached to the silicon wafer by the first solder bump. The semiconductor package includes an epoxy layer laterally around the active die and over the top surface. The epoxy layer includes a hole extending through the epoxy layer laterally outward from the active die. The second solder bump is exposed through the hole. The semiconductor package assembly includes an external memory die having an I/O contact electrically connected to the second solder bump through the hole.

In one embodiment, the first solder bump and the second solder bump are coplanar within a transverse plane parallel to the top surface.

In one embodiment, the active die includes an upper die surface. The epoxy layer includes an upper epoxy surface. The upper die surface and the upper epoxy surface are coplanar within a second transverse plane vertically offset from the transverse plane.

In one embodiment, the first solder bump is smaller than the second solder bump.

In one embodiment, the first solder bump is a plated solder bump. The second solder bump is a top-side-ball-attached solder bump.

In one embodiment, the semiconductor package assembly includes a redistribution layer mounted on the bottom surface. The redistribution layer includes several redistribution lines. At least one of the redistribution lines is electrically connected to the through-wafer-via. The semiconductor package assembly includes several solder balls on the redistribution layer. The several solder balls are electrically connected to the several redistribution lines.

In one embodiment, the semiconductor package assembly includes a printed circuit board having several contact pads. The several solder balls are mounted on the several contact pads.

In an embodiment, a method of fabricating a semiconductor package including an active die and an external die mount on a silicon wafer includes forming a first solder bump and a second solder bump on a top surface of a silicon wafer. The method includes attaching, by the first solder bump, an active die to the top surface. The method includes depositing an epoxy layer laterally around the active die and over the second solder bump. The method includes forming a hole in the epoxy layer above the second solder bump. The second solder bump is exposed through the hole.

In one embodiment, the first solder bump is smaller than the second solder bump.

In one embodiment, the method includes thinning one or more of the active die or the epoxy layer such that an upper die surface of the active die and an upper epoxy surface of the epoxy layer are coplanar within a transverse plane.

In one embodiment, the method includes mounting a carrier substrate on the upper die surface and the upper epoxy surface. The method includes forming a redistribution layer on a bottom surface. The redistribution layer includes several redistribution lines. At least one of the redistribution lines is electrically connected to a through-wafer-via extending from the first solder bump at the top surface to the bottom surface.

In one embodiment, the method includes removing the carrier substrate from the upper die surface and the upper epoxy surface. The method includes forming several solder balls on the redistribution layer. The several solder balls are electrically connected to the several redistribution lines.

In one embodiment, the carrier substrate is removed before forming the hole and forming the several solder balls.

What is claimed is:

1. A semiconductor package, comprising:
   a silicon structure having a through-silicon-via extending from a top surface to a bottom surface;
   a first solder bump and a second solder bump on the top surface;
   an active die mounted on the silicon structure, wherein the active die is attached to the silicon structure by the first solder bump; and
   an epoxy layer laterally around the active die and over the top surface, wherein the epoxy layer includes a hole extending through the epoxy layer, the hole laterally adjacent the active die, and wherein the second solder bump is exposed through the hole.

2. The semiconductor package of claim 1, wherein the first solder bump and the second solder bump are coplanar within a transverse plane parallel to the top surface.

3. The semiconductor package of claim 2, wherein the active die includes an upper die surface, wherein the epoxy layer includes an upper epoxy surface, and wherein the upper die surface and the upper epoxy surface are coplanar within a second transverse plane vertically offset from the transverse plane.

4. The semiconductor package of claim 1, wherein the first solder bump is smaller than the second solder bump.

5. The semiconductor package of claim 4, wherein the first solder bump is a plated solder bump, and wherein the second solder bump is a top-side-ball-attached solder bump.

6. The semiconductor package of claim 1 further comprising:
   a redistribution layer mounted on the bottom surface, wherein the redistribution layer includes a plurality of redistribution lines, and wherein at least one of the redistribution lines is electrically connected to the through-silicon-via; and
   a plurality of solder balls on the redistribution layer, wherein the plurality of solder balls are electrically connected to the plurality of redistribution lines.

7. The semiconductor package of claim 1, wherein the silicon structure is an active silicon structure having one or more integrated circuits.

8. The semiconductor package of claim 1, wherein the silicon structure is a silicon wafer portion.

9. A semiconductor package assembly, comprising:
   a semiconductor package including
       a silicon structure having a through-silicon-via extending from a top surface to a bottom surface,
       a first solder bump and a second solder bump on the top surface,
       an active die mounted on the silicon structure, wherein the active die is attached to the silicon structure by the first solder bump, and
       an epoxy layer laterally around the active die and over the top surface, wherein the epoxy layer includes a hole extending through the epoxy layer, the hole laterally adjacent the active die, and wherein the second solder bump is exposed through the hole; and
   an external memory die having an I/O contact electrically connected to the second solder bump through the hole.

10. The semiconductor package assembly of claim 9, wherein the first solder bump and the second solder bump are coplanar within a transverse plane parallel to the top surface.

11. The semiconductor package assembly of claim 10, wherein the active die includes an upper die surface, wherein the epoxy layer includes an upper epoxy surface, and wherein the upper die surface and the upper epoxy surface are coplanar within a second transverse plane vertically offset from the transverse plane.

12. The semiconductor package assembly of claim 9, wherein the first solder bump is smaller than the second solder bump.

13. The semiconductor package assembly of claim 12, wherein the first solder bump is a plated solder bump, and wherein the second solder bump is a top-side-ball-attached solder bump.

14. The semiconductor package assembly of claim 9 further comprising:
   a redistribution layer mounted on the bottom surface, wherein the redistribution layer includes a plurality of redistribution lines, and wherein at least one of the redistribution lines is electrically connected to the through-silicon-via; and
   a plurality of solder balls on the redistribution layer, wherein the plurality of solder balls are electrically connected to the plurality of redistribution lines.

15. The semiconductor package assembly of claim 14 further comprising a printed circuit board having a plurality of contact pads, wherein the plurality of solder balls are mounted on the plurality of contact pads.

16. The semiconductor package assembly of claim 9, wherein the silicon structure is a silicon wafer portion.

\* \* \* \* \*